(12) United States Patent
Kobayakawa et al.

(10) Patent No.: US 8,885,307 B2
(45) Date of Patent: *Nov. 11, 2014

(54) HEAT GENERATION AMOUNT ESTIMATION UNIT FOR BATTERY FOR ELECTRIC POWER TOOL, AND APPARATUS FOR ELECTRIC POWER TOOL

(75) Inventors: Tadahiko Kobayakawa, Anjo (JP); Hisakazu Okabayashi, Anjo (JP); Masaaki Fukumoto, Anjo (JP)

(73) Assignee: Makita Corporation, Anjo-Shi (JP)

( * ) Notice: Subject to any disclaimer, the term of this patent is extended or adjusted under 35 U.S.C. 154(b) by 159 days.

This patent is subject to a terminal disclaimer.

(21) Appl. No.: 13/641,348

(22) PCT Filed: Apr. 11, 2011

(86) PCT No.: PCT/JP2011/059022
§ 371 (c)(1),
(2), (4) Date: Oct. 15, 2012

(87) PCT Pub. No.: WO2011/132561
PCT Pub. Date: Oct. 27, 2011

(65) Prior Publication Data
US 2013/0033790 A1    Feb. 7, 2013

(30) Foreign Application Priority Data
Apr. 21, 2010  (JP) .................. 2010-098323

(51) Int. Cl.
H02H 7/00        (2006.01)
H01M 10/48       (2006.01)
H01M 10/44       (2006.01)
H02J 7/00        (2006.01)
H01M 10/46       (2006.01)

(52) U.S. Cl.
CPC ............. *H02J 7/0021* (2013.01); *H01M 10/48* (2013.01); *H01M 10/44* (2013.01); *H01M 10/46* (2013.01); *H01M 10/486* (2013.01)
USPC .......................................... 361/87

(58) Field of Classification Search
USPC .......................................... 361/87
See application file for complete search history.

(56) References Cited

U.S. PATENT DOCUMENTS 5,397,974 A    3/1995  Tamai et al.
8,018,182 B2 * 9/2011  Roehm et al. ............... 318/139
(Continued)

FOREIGN PATENT DOCUMENTS

JP    A-6-225451    8/1994
JP    A-6-276696    9/1994
(Continued)

OTHER PUBLICATIONS

International Preliminary Report on Patentability issued in International Patent Application No. PCT/JP2011/059022 dated Nov. 20, 2012.

(Continued)

*Primary Examiner* — Stephen W Jackson
(74) *Attorney, Agent, or Firm* — Oliff PLC

(57) ABSTRACT

A disclosed heat generation amount estimation unit is used for a battery for an electric power tool, and estimates a heat generation amount of the battery that is a power source of the electric power tool. The heat generation amount estimation unit includes a computation device, and is provided in an apparatus for electric power tool. The computation device periodically reads, either during a discharge from the battery or during a charge to the battery, a detected current from a current detection device, which detects a current corresponding to this point in time from among a discharge current and a charge current flowing through the battery, and adds/subtracts a heat generation amount equivalent value in accordance with a value of the read detected current. The computation device outputs the added/subtracted heat generation amount equivalent value as an estimated value representing the heat generation amount of the battery.

15 Claims, 9 Drawing Sheets

(56) References Cited

U.S. PATENT DOCUMENTS

| | | |
|---|---|---|
| 8,084,153 B2 * | 12/2011 | Tamakoshi et al. ............ 429/61 |
| 2002/0149346 A1 | 10/2002 | Sakakibara |
| 2004/0135553 A1 | 7/2004 | Sakakibara |
| 2007/0013341 A1 | 1/2007 | Hitomi et al. |

FOREIGN PATENT DOCUMENTS

| | | |
|---|---|---|
| JP | A-7-1350 | 1/1995 |
| JP | A-11-198062 | 7/1999 |
| JP | A-2001-76769 | 3/2001 |
| JP | A-2001-136673 | 5/2001 |
| JP | A-2002-315198 | 10/2002 |
| JP | A-2004-208349 | 7/2004 |
| JP | A-2005-39876 | 2/2005 |
| JP | A-2006-247821 | 9/2006 |
| JP | A-2007-26712 | 2/2007 |
| JP | A-2009-95162 | 4/2009 |

OTHER PUBLICATIONS

Office Action issued in Japanese Patent Application No. 2010-098323 dated Dec. 17, 2013 (with translation).

Office Action issued in Chinese Patent Application No. 201180019959.4 dated Mar. 5, 2014 (with translation).

International Search Report issued in International Patent Application No. PCT/JP2011/059022 dated Jul. 5, 2011.

* cited by examiner

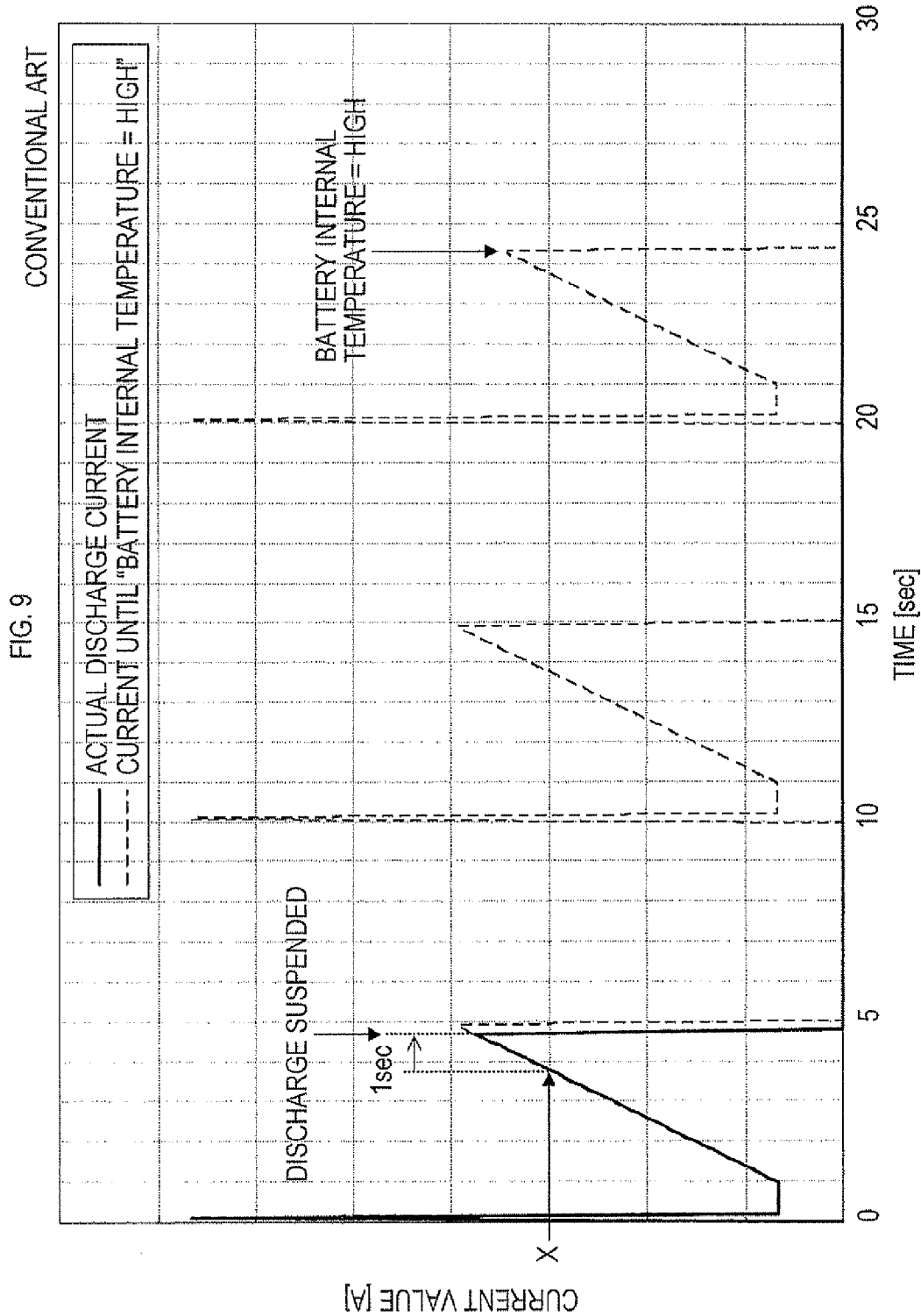

HEAT GENERATION AMOUNT ESTIMATION UNIT FOR BATTERY FOR ELECTRIC POWER TOOL, AND APPARATUS FOR ELECTRIC POWER TOOL

CROSS-REFERENCE TO RELATED APPLICATIONS

This international application claims the benefit of Japanese Patent Application No. 2010-098323 filed Apr. 21, 2010 in the Japan Patent Office, and the entire disclosure of Japanese Patent Application No. 2010-098323 is incorporated herein by reference.

TECHNICAL FIELD

The present invention relates to a heat generation amount estimation unit that estimates a heat generation amount of a battery used as a power source of an electric power tool, and an apparatus for electric power tool including the heat generation amount estimation unit therein.

BACKGROUND ART

A conventional battery used as a power source of an electronic device has a problem in which the battery is deteriorated when a temperature during charge or discharge deviates from a given temperature range.

Therefore, it has been conventionally proposed to detect a discharge current from the battery or a charge current to the battery, and to suspend charging or discharging when the detected current has exceeded a predetermined threshold value, as a result of determining that the battery will generate heat to thereby deteriorate battery properties (see Patent Document 1, for example).

PRIOR ART DOCUMENTS

Patent Documents

Patent Document 1: JP06225451A

SUMMARY OF THE INVENTION

Problems to be Solved by the Invention

However, a battery temperature is not changed only according to the discharge current or the charge current, but changed according to these current values and a time period for which the current flows.

Accordingly, in some cases in the above-described conventional art, despite a state where a heat generation amount of the battery is small and the battery can perform charge or discharge with no trouble, the charge or discharge is suspended when the detected current value has reached the threshold value.

Furthermore, in some cases in the above-described conventional art, despite a state where a charging time period or a discharging time period of the battery is so long that the battery has been heated to a high temperature, charge to the battery or discharge from the battery is not suspended because the detected current value has not reached the threshold value, and thereby the battery is deteriorated.

Especially in a case of an electric power tool, a high current flows through a driving power source such as a motor, and the current value and a current-carrying time period significantly vary depending on a usage state of the electric power tool.

Therefore, there is a problem with the above-described conventional art in that the battery cannot be adequately protected.

In order to suppress this problem, it is also possible to detect a battery temperature using a temperature sensor such as a thermistor, and to suspend or limit the charge to the battery or the discharge from the battery when the detected temperature has reached a predetermined overheat determination temperature.

However, what can be detected using the temperature sensor is a surface temperature of the battery, and an internal temperature, which affects a battery life, cannot be detected. Therefore, the battery cannot be adequately protected by such an overheat protection using the temperature sensor.

The present invention has been made in view of such problems, and it is an object of the present invention to provide an apparatus for electric power tool in which a heat generation amount of a battery for electric power tool is estimated and the heat generation amount (in other words, an internal temperature) can be suppressed from reaching a limit temperature, which is an upper limit of an allowable temperature range.

Means for Solving the Problems

The present invention made to achieve such an object relates to a heat generation amount estimation unit that estimates a heat generation amount of a battery, which is a power source of an electric power tool.

In the heat generation amount estimation unit of a first aspect of the present invention, a computation device periodically reads a detected current from a current detection device either during a discharge from the battery or during a charge to the battery, and adds/subtracts a heat generation amount equivalent value in accordance with a value of the read detected current. In this regard, the computation device periodically reads the detected current from the current detection device that detects a current corresponding to this point in time from among a discharge current flowing from the battery and a charge current flowing into the battery. Then, the computation device outputs the added/subtracted heat generation amount equivalent value as an estimated value representing the heat generation amount of the battery.

The heat generation amount of the battery is changed in accordance with a current flowing during the charge/discharge of the battery and a charging/discharging time period. Specifically, the greater the charge/discharge current is and the longer the charging/discharge time period is, the greater the heat generation amount is. Accordingly, in the present invention, the current flowing through the battery is periodically detected, and the heat generation amount of the battery is estimated by adding/subtracting the heat generation amount equivalent value in accordance with the value of the detected current.

Thus, according to the heat generation amount estimation unit of the present invention, it is possible to accurately estimate the heat generation amount (in other words, an internal temperature) of the battery from the current flowing either during the charge to the battery or during the discharge from the battery. Consequently, when the charge/discharge of the battery is controlled using the estimated value, the battery can be suppressed from deteriorating due to overheat without unnecessarily suspending or limiting the charge/discharge.

Here, in the present invention, the heat generation amount equivalent value is added/subtracted based on the value of the detected current obtained from the current detection device.

For this, it is preferable that an add/subtract value setting device is provided in the heat generation amount estimation unit.

In the heat generation amount estimation unit of a second aspect of the present invention, when the value of the detected current is less than a predetermined threshold value, the add/subtract value setting device sets a negative add/subtract value including zero such that the smaller the value of the detected current is the greater an absolute value is. In contrast, when the value of the detected current is equal to or greater than the predetermined threshold value, the add/subtract value setting device sets a positive add/subtract value such that the greater the value of the detected current is, the greater the add/subtract value is. Then, the computation device updates the heat generation amount equivalent value by adding the negative add/subtract value or the positive add/subtract value set by the add/subtract value setting device to the heat generation amount equivalent value.

According to the heat generation amount estimation unit, the heat generation amount equivalent value (the estimated value) is to be periodically updated in accordance with the current flowing during the charge/discharge of the battery, such that the greater the value of the current is, the greater the heat generation amount equivalent value is, and the smaller the value of the current is, the smaller the heat generation amount equivalent value is. As a result, the heat generation amount of the battery can be accurately estimated from the heat generation amount equivalent value.

Meanwhile, the heat generation amount of the battery is changed not only by an amount of the current flowing through the battery but also by a surface temperature (and thus, an ambient temperature) of the battery. Specifically, when the surface temperature of the battery is low, the heat generation amount is small. Therefore, the add/subtract value setting device may be configured as below.

In the heat generation amount estimation unit of a third aspect of the present invention, the add/subtract value setting device sets the add/subtract value based on the value of the detected current obtained from the current detection device and a detected temperature from a temperature detection device, which detects a temperature (specifically, the surface temperature or the ambient temperature) of the battery, such that the greater the value of the detected current is and the higher the detected temperature is, the greater the add/subtract value is.

According to the heat generation amount estimation unit, even when the temperature of the battery is significantly changed depending on a use state of the electric power tool, the heat generation amount equivalent value can be added/subtracted in accordance with the temperature. As a result, the heat generation amount of the battery can be estimated more accurately.

A fourth aspect of the present invention is an apparatus for electric power tool including the above-described heat generation amount estimation unit, a determination device, and a protection device therein.

In the apparatus for electric power tool of the fourth aspect, the determination device determines whether or not the estimated value representing the heat generation amount of the battery obtained by the heat generation amount estimation unit has exceeded a set value for overheat determination set in advance. If it is determined by the determination device that the estimated value has exceeded the set value, the protection device performs either of a suspension processing and a limitation processing to protect the battery. The suspension processing is a processing that suspends an operation corresponding to this point in time from among the discharge from the battery and the charge to the battery. The limitation processing is a processing that limits the operation corresponding to this point in time from among the discharge from the battery and the charge to the battery.

According to the apparatus for electric power tool, the battery can be suppressed from deterioration or breakage due to overheat occurring when the heat generation amount of the battery exceeds the set value for overheat determination either during the charge or during the discharge.

Here, when limiting either of the discharge from the battery and the charge to the battery, it is preferable that the protection device corrects a control threshold value used either for a charge control of the battery or for a discharge control of the battery.

As the discharge control of the battery, it is known, for example, to perform following limitations:
- a discharge current limitation that limits a discharge current to equal to or less than a predetermined threshold value
- an overdischarge limitation that suppresses a battery voltage from lowering to equal to or less than a predetermined threshold value
- a battery temperature limitation that suppresses a battery temperature (a surface temperature detected using a thermistor or the like) from exceeding a predetermined threshold value On the other hand, as the charge control of the battery, it is known, for example, to perform following limitations:
- a charge current limitation that limits a charge current to equal to or less than a predetermined threshold value
- an overcharge limitation that suspends a charge when a battery voltage has reached a threshold value for full charge determination
- a battery temperature limitation that suppresses a battery temperature from exceeding a predetermined threshold value In the apparatus for electric power tool of a fifth aspect, the protection device limits the current flowing during the charge/discharge of the battery by correcting the threshold values used for these charge/discharge controls, to thereby suppress a rise in temperature (overheat) of the battery.

Thus, according to the apparatus for electric power tool of the fifth aspect, when the heat generation amount of the battery has exceeded the set value for overheat determination, the charge/discharge of the battery can be limited easily and reliably.

The protection device may be configured to also perform a control to suspend the charge/discharge in addition to the above-described limitations of the charge/discharge. Specifically, the protection device may be configured to limit the charge/discharge when the heat generation amount of the battery has exceeded a first set value, and to suspend the charge/discharge when the heat generation amount of the battery has exceeded a second set value, which is greater than the first set value. Such a configuration makes it possible to protect the battery more reliably.

Moreover, the protection device may be configured, if it is determined by the determination device that the estimated value of the heat generation amount has exceeded the set value either during the discharge from the battery or during the charge to the battery, to correct a control threshold value used either during a next charge to the battery or during a next discharge from the battery to thereby limit either of the next charge and the next discharge.

The above-described apparatus for electric power tool may be any of a battery pack containing the battery therein, an electric power tool main body to which the battery pack is detachably attached, and a battery charger to which the battery pack is detachably attached.

Furthermore, functions as the computation device, the add/subtract value setting device, the determination device, and the protection device described above can be implemented by a computer using a program. Specifically, it is possible to record a program for allowing the computer to implement at least one of the functions as the computation device, the add/subtract value setting device, the determination device, and the protection device described above in a computer-readable recording medium, and to provide such a recording medium to a user.

As the computer-readable recording medium, a magnetic disk such as a hard disk, an optical disk such as a CD-ROM and a DVD, and a semiconductor memory such as a USB memory can be listed, for example.

BRIEF DESCRIPTION OF THE DRAWINGS

FIG. 9 is an explanatory diagram showing a discharge suspension operation according to conventional art.

EXPLANATION OF REFERENCE NUMERALS

10 . . . main body (electric power tool main body), 14 . . . motor housing, 16 . . . gear housing, 18 . . . drill chuck, 20 . . . hand grip, 22 . . . trigger switch, SW1 . . . main switch, 24 . . . battery pack attachment portion, 32A . . . positive terminal, 32B . . . negative terminal, 34A . . . signal terminal, 36 . . . control power circuit, 38 . . . input/output circuit, L1A . . . positive power supply line, L1B . . . negative power supply line, M1 . . . drive motor, Q1 . . . transistor (N-channel MOSFET), 40 . . . battery pack, 42 . . . connector portion, 44 . . . power supply terminal portion, 44A . . . positive terminal, 44B . . . negative terminal, 46 . . . connection terminal portion, 46A-46C . . . signal terminal, 50 . . . battery, 52A . . . positive terminal, 52B . . . negative terminal, 60 . . . battery control circuit, 62 . . . current measurement circuit, 64 . . . voltage measurement circuit, 66 . . . temperature measurement circuit, 68 . . . switch operation detection circuit, 70 . . . MCU, 70A . . . ROM, 72 . . . battery charger detection circuit, L2A . . . positive power supply line, L2B . . . negative power supply line, Q4 . . . transistor (N-channel MOSFET), 80 . . . battery charger, 82 . . . battery pack attachment portion, 84 . . . power supply terminal portion, 84A . . . positive terminal, 84B . . . negative terminal, 86 . . . connection terminal portion, 86B, 86C . . . signal terminal, 88 . . . indicator portion, 92 . . . rectifier circuit, 94 . . . charging switching power circuit, 96 . . . MCU, 98 . . . controlling switching power circuit

MODE FOR CARRYING OUT THE INVENTION

An embodiment of the present invention is described below with reference to the drawings.
(Overall Configuration of Electric Power Tool)

Figure 1:
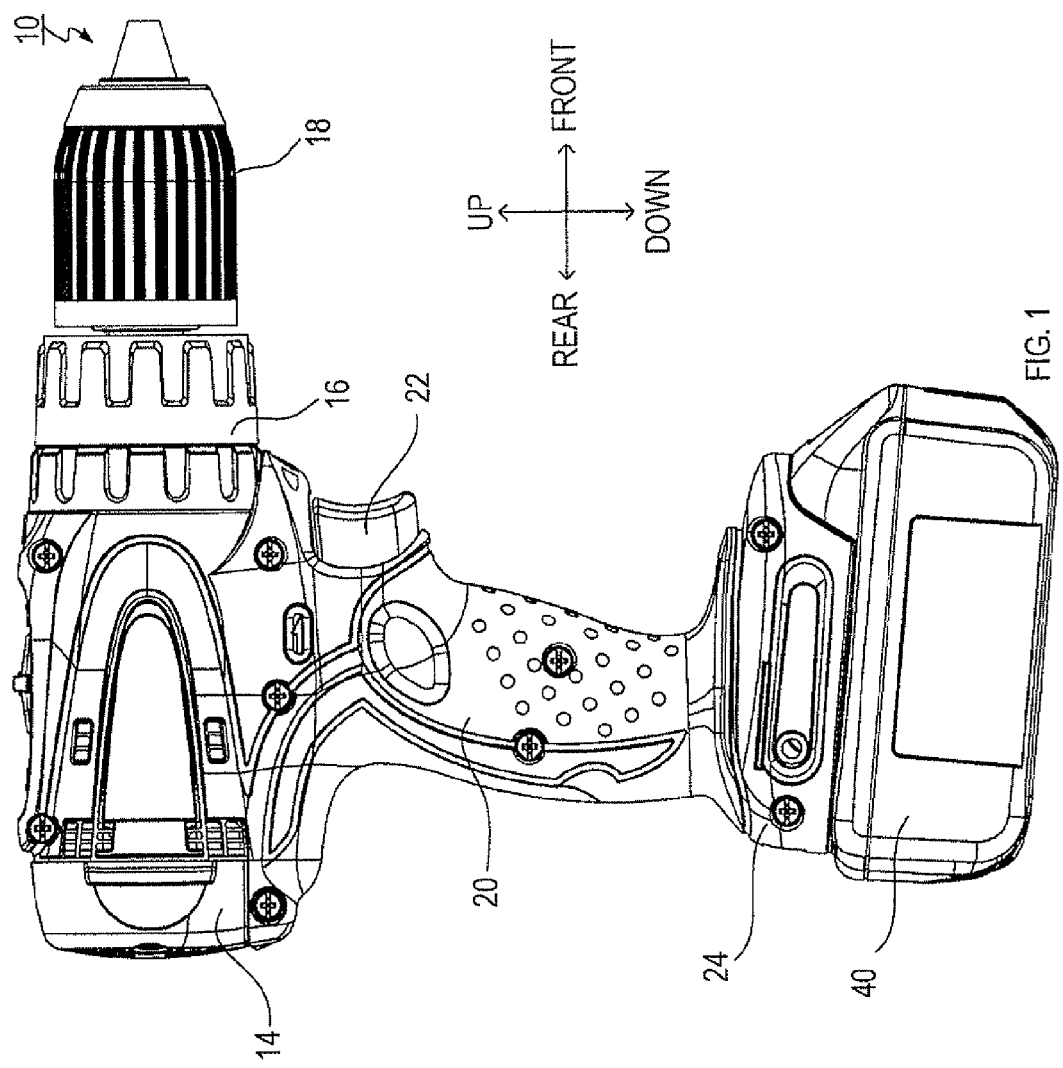
FIG. 1 is a side view showing a state where a battery pack is attached to an electric power tool main body of an embodiment.

As shown in FIG. 1, an electric power tool according to the present embodiment includes an electric power tool main body (hereinafter, also simply referred to as a "main body") 10, which is configured as a so-called driver drill; and a battery pack 40, which is detachably attached to the main body 10 to supply DC power to the main body 10.

The main body 10 includes a motor housing 14, a gear housing 16 positioned forward from the motor housing 14, a drill chuck 18 positioned forward from the gear housing 16, and a hand grip 20 positioned below the motor housing 14.

The motor housing 14 houses a drive motor M1 (see FIG. 4) that generates driving force to rotationally drive the drill chuck 18.

The gear housing 16 houses a gear mechanism (not shown) that transmits the driving force of the drive motor M1 to the drill chuck 18.

The drill chuck 18 includes an attachment mechanism (not shown) for detachable attachment of a tool bit (not shown) at a front end of the drill chuck 18.

The hand grip 20 is shaped such that a user of the electric power tool can hold the hand grip 20 with a single hand. At an upper front of the hand grip 20, there is provided a trigger switch 22 for the user of the electric power tool to drive or stop the drive motor M1.

Also, at a lower end of the hand grip 20, a battery pack attachment portion 24 is provided to detachably attach the battery pack 40 to the main body 10.

Figure 2:
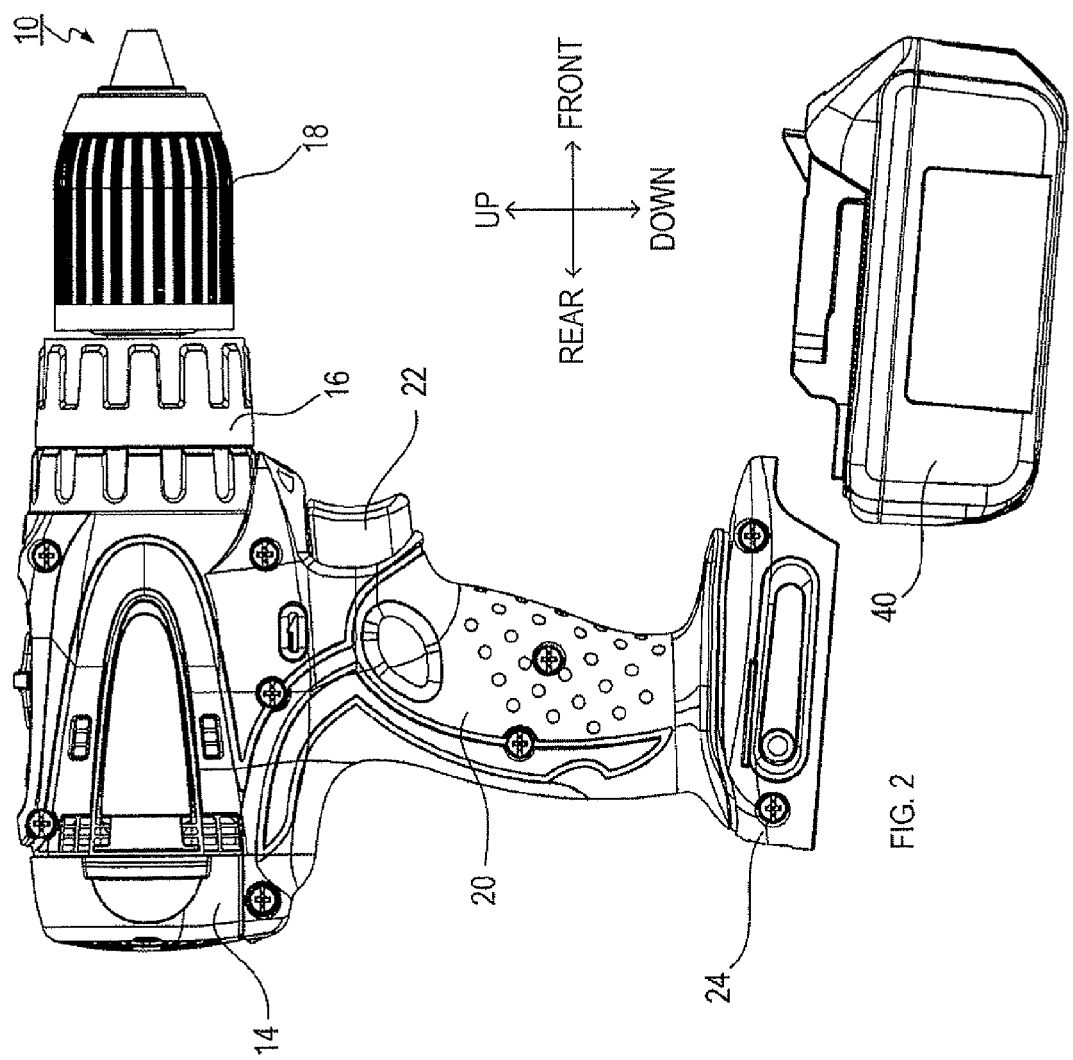
FIG. 2 is a side view showing a state where the battery pack is detached from the electric power tool main body of the embodiment.

More specifically, as shown in FIG. 2, the battery pack attachment portion 24 is configured such that the battery pack 40 can be detached from the battery pack attachment portion 24 when the user of the electric power tool slides the battery pack 40 in a forward direction.

Figure 3A:
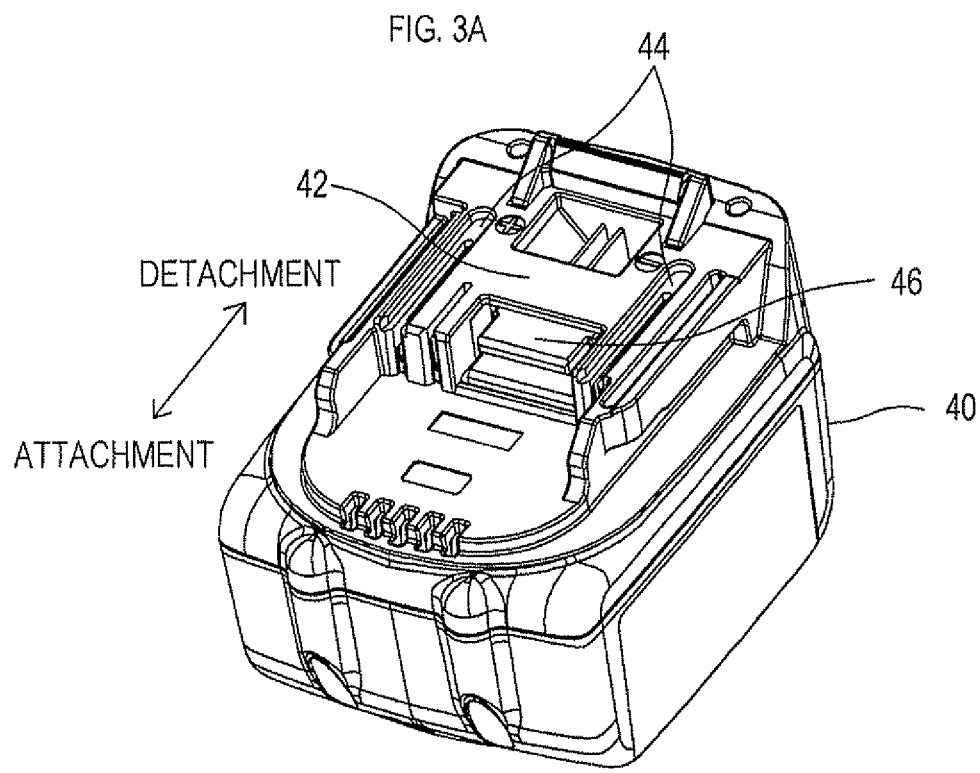
FIG. 3A is a perspective view showing an appearance of the battery pack of the embodiment.
Figure 3B:
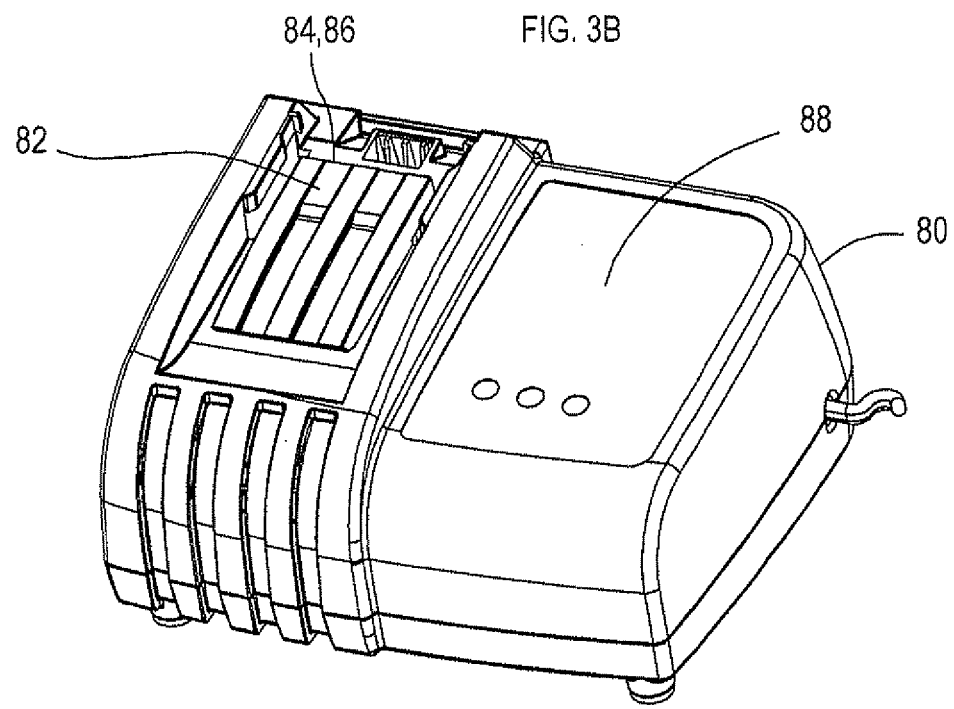
FIG. 3B is a perspective view showing an appearance of a battery charger.

As shown in FIG. 3A, a connector portion 42 for connection to the battery pack attachment portion 24 of the main body 10 or a battery charger 80 shown in FIG. 3B is formed in an upper region of the battery pack 40. The connector portion 42 includes a power supply terminal portion 44 and a connection terminal portion 46 for connection to a battery and a control circuit inside the battery pack 40.

Figure 4:
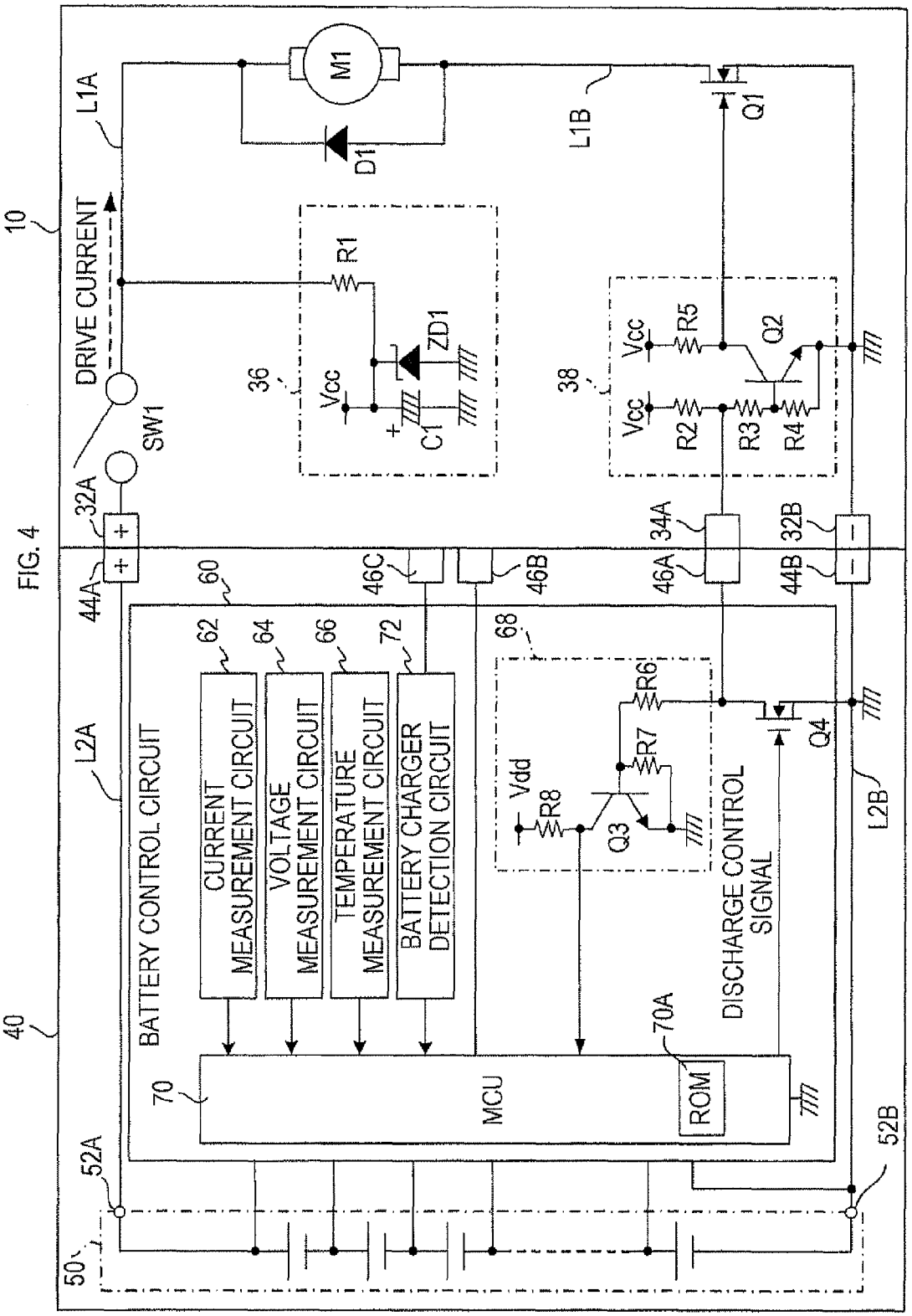
FIG. 4 is a circuit diagram showing an electronic circuit provided in the electric power tool main body and the battery pack of the embodiment.

When attached to the battery pack attachment portion 24 of the main body 10 through the connector portion 42, the battery pack 40 is electrically connected to an internal circuit of the main body 10 through the power supply terminal portion 44 and the connection terminal portion 46, to thereby become capable of supplying DC power to the main body 10 (see FIG. 4).

As shown in FIG. 3B, formed on an upper region of the battery charger 80 are a battery pack attachment portion 82 and an indicator portion 88 including a plurality of indicator lamps for indicating a state where the battery charger 80 is charging the battery pack 40 and the like.

The battery pack attachment portion 82 of the battery charger 80 is configured such that the battery pack 40 can be attached by mating an end portion of the connector portion 42 of the battery pack 40 with the battery pack attachment portion 82, with the connector portion 42 facing downward, and then sliding the battery pack 40 in an attachment direction.

Provided on the battery pack attachment portion 82 are a power supply terminal portion 84 and a connection terminal portion 86, which are respectively to be electrically connected to the power supply terminal portion 44 and the connection terminal portion 46 of the battery pack 40 when the battery pack 40 is attached to the battery charger 80. When each of these terminal portions is connected to its counterpart, charge from the battery charger 80 to the battery pack 40 becomes possible (see FIG. 5).

The battery pack attachment portion 24 of the main body 10 is configured to be capable of mating with the connector portion 42 of the battery pack 40 as well as with the battery charger 80.

(Circuit Configuration of the Electric Power Tool Main Body 10)

FIG. 4 is a circuit diagram showing a circuit for controlling the drive motor M1. The circuit is formed of the battery pack 40 and the main body 10 when the battery pack 40 is attached to the main body 10.

As shown in FIG. 4, the main body 10 includes a positive terminal 32A and a negative terminal 32B for connection to the power supply terminal portion 44 of the battery pack 40 as well as a signal terminal 34A for connection to the connection terminal portion 46.

The positive terminal 32A is connected to one end of the drive motor M1 through a main switch SW1 and a positive power supply line L1A, while the negative terminal 32B is connected to an other end of the drive motor M1 through a transistor Q1 for controlling current-supply to the drive motor M1 and a negative power supply line L1B.

In the present embodiment, the drive motor M1, which is constituted as a brushed DC motor, is energized and rotated when the transistor Q1 is turned on by an input signal from the battery pack 40 while the main switch SW1 is in an ON state.

A diode (a so-called flywheel diode) D1 is connected to the drive motor M1 in order to return a high voltage, which is generated in the negative power supply line L1B when the transistor Q1 is turned off, to the positive power supply line L1A.

The main switch SW1 is switchable between ON and OFF states in conjunction with the above-described trigger switch 22. Specifically, the main switch SW1 is turned on when the trigger switch 22 is depressed, while the main switch SW1 is turned off when the trigger switch 22 is released.

The transistor Q1 employed here is an N-channel MOSFET.

The main body 10 also includes a control power circuit 36, which generates a power supply voltage for driving the internal circuit, and an input/output circuit 38, which inputs/outputs signals from/to the battery pack 40.

The control power circuit 36 includes a Zener diode ZD1 and a capacitor C1. A cathode of the Zener diode ZD1 is connected to the positive power supply line L1A through a resistor R1, while an anode of the Zener diode ZD1 is earthed to a ground of the main body 10.

The capacitor C1 is constituted by an electrolytic capacitor. A positive side of the capacitor C1 is connected to the positive power supply line L1A through the resistor R1 together with the cathode of the Zener diode ZD1, while a negative side of the capacitor C1 is earthed to the ground of the main body 10.

The negative terminal 32B is connected to the ground of the main body 10. When the battery pack 40 is attached to the main body 10, the ground of the main body 10 is connected to a negative power supply line L2B of the battery pack 40 (thus to a negative terminal 52B of a battery 50) through the negative terminal 32B.

Also, when the main switch SW1 is in an ON state, the positive power supply line L1A is connected to a positive power supply line L2A of the battery pack 40 (thus to a positive terminal 52A of the battery 50) through the positive terminal 32A.

Accordingly, in the control power circuit 36, when the main switch SW1 is in an ON state, a battery voltage (for example, DC 36 V) is applied to the anode of the Zener diode ZD1 from the positive power supply line L1A through the resistor R1, and the battery voltage is lowered to a predetermined constant voltage (for example, DC 5 V) by the Zener diode ZD1.

Then, the capacitor C1 is charged with the lowered DC voltage, and a voltage between both terminals of the capacitor C1 is supplied to various internal circuits of the main body 10 as a power supply voltage Vcc to activate the internal circuits.

The input/output circuit 38 includes a transistor Q2 and resistors R2, R3, R4, and R5.

The transistor Q2 is constituted by an NPN bipolar transistor. A base of the transistor Q2 is connected to the signal terminal 34A through the resistor R3 while being earthed to the ground through the resistor R4.

The power supply voltage Vcc is applied to the signal terminal 34A through the resistor R2, and the power supply voltage Vcc is also applied to a collector of the transistor Q2 through the resister R5. The collector of the transistor Q2 is also connected to a gate of the transistor Q1, and an emitter of the transistor Q2 is earthed to the ground.

Resistance values of the resistors R2, R3, and R4 are set such that, when the power supply voltage Vcc has reached a predetermined voltage after the main switch SW1 is turned on, the transistor Q2 is turned on and an electric potential of the signal terminal 34A becomes high level in a vicinity of the power supply voltage Vcc.

When the transistor Q2 is in an ON state, the gate of the transistor Q1 is earthed to the ground through the transistor Q2, and thereby the transistor Q1 is brought into an OFF state to interrupt a current path to the drive motor M1.

When the signal terminal 34A is earthed to the ground through an internal circuit (a transistor Q4, which will be described later) of the battery pack 40, the transistor Q2 is brought into an OFF state. In this state, the power supply voltage Vcc is applied to the gate of the transistor Q1 through the resistor R5, and thereby the transistor Q1 is brought into an ON state to form the current path to the drive motor M1.

While the collector of the transistor Q2 is directly connected to the gate of the transistor Q1 in the present embodiment, the collector of the transistor Q2 may be connected to the gate of the transistor Q1 through a drive circuit for switching the transistor Q1.

(Circuit Configuration of the Battery Pack 40)

The battery pack 40 includes a positive terminal 44A and a negative terminal 44B provided in the power supply terminal portion 44, three signal terminals 46A, 46B, and 46C provided in the connection terminal portion 46, the battery 50, and a battery control circuit 60.

The positive terminal 52A of the battery 50 is connected to the positive terminal 44A through the positive power supply line L2A, while the negative terminal 52B of the battery 50 is connected to the negative terminal 44B through the negative power supply line L2B.

When the battery pack 40 is attached to the main body 10, the positive terminal 44A is connected to the positive terminal 32A of the main body 10, the negative terminal 44B is connected to the negative terminal 32B of the main body 10, and the signal terminal 46A is connected to the signal terminal 34A of the main body 10.

The signal terminals 46B and 46C are designed to be connected to the connection terminal portion 86 of the battery charger 80 when the battery pack 40 is attached to the battery charger 80, and are in an open state when the battery pack 40 is attached to the main body 10.

The battery 50 is constituted by a plurality of (for example, ten) battery cells connected in series between the positive terminal 52A and the negative terminal 52B, and generates a drive voltage (for example, DC 36 V) for driving the drive motor M1.

Each of the battery cells is constituted, for example, by a lithium-ion rechargeable battery that generates DC 3.6 V on a standalone basis. Therefore, the battery 50 can achieve high output power, and a discharge current that can be outputted is 10 A or more, for example.

The battery control circuit 60 includes a current measurement circuit 62, a voltage measurement circuit 64, a temperature measurement circuit 66, a switch operation detection circuit 68, a battery charger detection circuit 72, a main control unit (MCU) 70, and the transistor Q4.

The current measurement circuit 62 here is designed to detect a current flowing through the positive power supply line L2A or the negative power supply line L2B, and outputs to the MCU 70 a current detection signal having a voltage value corresponding to the detected current.

The voltage measurement circuit 64 measures voltages of the respective battery cells constituting the battery 50 in sequence, and outputs to the MCU 70 voltage detection signals having voltage values corresponding to the measured voltages.

The temperature measurement circuit 66, which includes a thermistor disposed around the battery 50, measures a battery temperature via the thermistor, and outputs to the MCU 70 a temperature detection signal having a voltage value corresponding to the measured temperature.

The switch operation detection circuit 68, which is designed to detect that the trigger switch 22 of the main body 10 is operated, includes a transistor Q3, resistors R6, R7, and R8.

The transistor Q3 is constituted by an NPN bipolar transistor. A base of the transistor Q3 is connected to the signal terminal 46A through the resistor R6 while being earthed to a ground of the battery pack 40 through the resistor R7. Also, an emitter of the transistor Q3 is earthed to the ground.

The ground of the battery pack 40 is connected to the negative power supply line L2B. Accordingly, when the battery pack 40 is attached to the main body 10, the ground of the battery pack 40 and the ground of the main body 10 have a same electric potential, and each of these grounds has a same electrical potential as a negative electrode of the battery 50.

A collector of the transistor Q3 is connected to the MCU 70 and also connected, through the resistor R8, to an output path of a power supply voltage Vdd (for example, DC 5 V) from a control power circuit (not shown) provided in the battery pack 40.

The control power circuit is designed to receive power supply from the battery 50, generate the constant power supply voltage Vdd, and perform power supply to various electronic circuits in the battery pack 40. The control power circuit is constituted by, for example, a switching power circuit or the like.

The transistor Q4 is constituted by an N-channel MOSFET. A drain of the transistor Q4 is connected to the signal terminal 46A, to which the base of the transistor Q3 is connected through the resistor R6. Furthermore, a source of the transistor Q4 is earthed to the ground, and a gate of the transistor Q4 is connected to the MCU 70.

Accordingly, the transistor Q4 is turned on/off by an output signal (a discharge control signal, which will be described later) from the MCU 70. When the transistor Q4 is in an OFF state, the signal terminal 46A is in an open state.

Consequently, when the battery pack 40 is attached to the main body 10 and the trigger switch 22 is operated (the main switch SW1: ON), if the transistor Q4 is in an OFF state, a high level signal corresponding to the power supply voltage Vcc in the battery pack 40 is inputted from the signal terminal 34A of the main body 10 to the signal terminal 46A of the battery pack 40. Then, the transistor Q3 in the switch operation detection circuit 68 is brought into an ON state, and an input signal from the switch operation detection circuit 68 to the MCU 70 becomes low level.

Even when the battery pack 40 is attached to the main body 10, if the trigger switch 22 is not operated (the main switch SW1: OFF), the signal terminal 34A of the main body 10 is low level (a ground potential). Then, the transistor Q3 in the switch operation detection circuit 68 is brought into an OFF state, and the input signal from the switch operation detection circuit 68 to the MCU 70 becomes high level.

The battery charger detection circuit 72 is designed such that when the battery pack 40 is attached to the battery charger 80 and a high level signal (of, for example, DC 5 V) is inputted from the battery charger 80 to the signal terminal 46C, the battery charger detection circuit 72 outputs a detection signal indicating that effect. The battery charger detection circuit 72 is configured in a same manner as the switch operation detection circuit 68.

Specifically, when the signal terminal 46C is in an open state, the battery charger detection circuit 72 inputs a high level signal corresponding to the power supply voltage Vdd to the MCU 70 through a pull-up resistor. When the high level signal is inputted from the battery charger 80 to the signal terminal 46C, a transistor connected to a signal path to the MCU 70 is brought into an ON state, and the signal path is earthed to the ground to make an output to the MCU 70 low level.

Accordingly, the MCU 70 can detect that the trigger switch 22 has been operated in the main body 10, to which the battery pack 40 is attached, based on the input signal from the switch operation detection circuit 68, and also can detect that the battery pack 40 has been attached to the battery charger 80 based on the input signal from the battery charger detection circuit 72.

The MCU 70 is constituted by a known microcomputer including a CPU, a ROM 70A, a RAM, a rewritable nonvolatile memory, an input/output (I/O) port, an A/D converter, and the like, and operates in accordance with various programs stored in the ROM 70A. The operation of the MCU 70 will be described later.

(Circuit Configuration of the Battery Charger 80)

Figure 5:
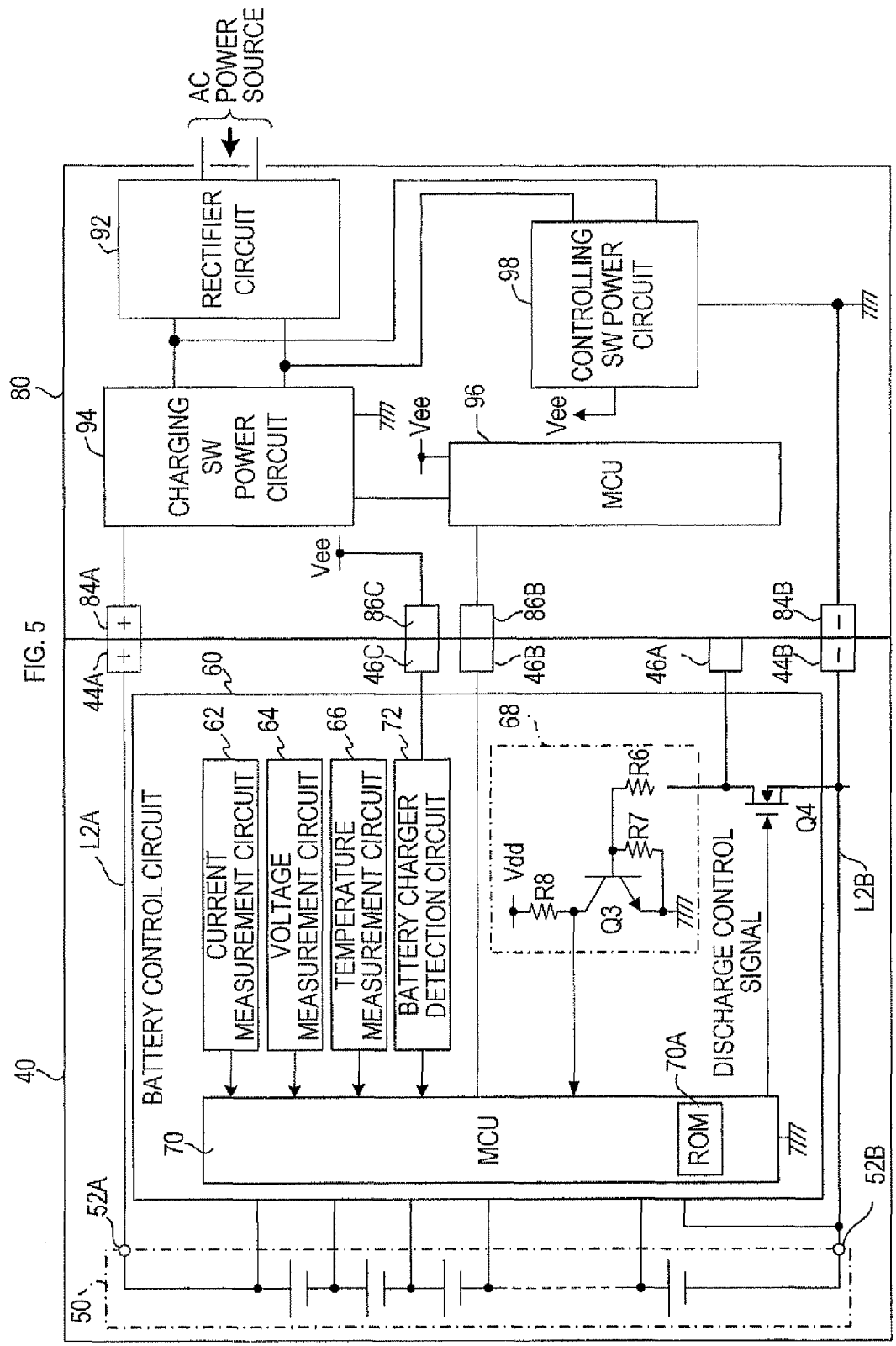
FIG. 5 is a circuit diagram showing an electronic circuit provided in the battery pack and the battery charger of the embodiment.

FIG. 5 is a circuit diagram showing a battery charging circuit formed of the battery pack 40 and the battery charger 80 when the battery pack 40 is attached to the battery charger 80.

As shown in FIG. 5, the battery charger 80 includes a positive terminal 84A and a negative terminal 84B, as the power supply terminal portion 84, respectively to be connected to the positive terminal 44A and the negative terminal 44B of the battery pack 40; and signal terminals 86B and 86C, as the connection terminal portion 86, respectively to be connected to the signal terminals 46B and 46C of the battery pack 40.

The battery charger 80 further includes a rectifier circuit 92, a charging switching power circuit 94, a main control unit (MCU) 96, and a controlling switching power circuit 98.

The rectifier circuit 92 is designed to rectify an AC voltage supplied from an AC power source such as a commercial power source, and a rectified output is outputted to the charging switching power circuit 94 and the controlling switching power circuit 98.

The charging switching power circuit 94 is a switching circuit that charges the battery 50 based on the output from the rectifier circuit 92, and is drive-controlled by the MCU 96.

The MCU 96 is constituted by a microcomputer as well as the MCU 70 in the battery pack 40. The MCU 96 acquires a battery state from the MCU 70 in the battery control circuit 60 through the signal terminals 46B and 86B, and controls patterns of charging to the battery 50 (charge current, charge voltage, and the like) by drive-controlling the charging switching power circuit 94.

The controlling switching power circuit 98 is designed to generate a power supply voltage Vee (for example, DC 5 V) for operating an internal circuit of the MCU 96 and the like.

A ground of the battery charger 80 is connected to the negative terminal 52B of the battery 50 through the negative terminal 84B and the negative terminal 44B of the battery pack 40, and a charge voltage generated in the charging switching power circuit 94 is applied to the positive terminal 52A of the battery 50 through the positive terminal 84A and the positive terminal 44A of the battery pack 40.

To the signal terminal 86C of the battery charger 80, the power supply voltage Vee generated in the controlling switching power circuit 98 is applied.

Accordingly, when the battery pack 40 is attached to the battery charger 80 and the power supply voltage Vee is generated in the controlling switching power circuit 98, on a side of the battery pack 40, a high level signal corresponding to the power supply voltage Vee is inputted to the battery charger detection circuit 72 through the signal terminals 86C and 46C. Then, a signal level of a detection signal inputted from the battery charger detection circuit 72 to the MCU 70 is to be changed from high level to low level.

There is provided on the battery charger 80 the indicator portion 88 including the plurality of indicator lamps, which are lit by the MCU 96 in accordance with a state of charging the battery 50.

(Operation of the MCU 70 in the Battery Pack 40)

Next, an explanation will be given about an operation of the MCU 70 in the battery pack 40.

The MCU 70 generally operates in a sleep mode (in other words, in a low power consumption mode), in which a detection signal from the switch operation detection circuit 68 or the battery charger detection circuit 72 is monitored as to whether the detection signal has become low level from high level. When the detection signal from the switch operation detection circuit 68 or the battery charger detection circuit 72 has become low level from high level, the MCU 70 is activated and shifts to a normal mode in which the battery 50 is protected.

When the MCU 70 is in the sleep mode, the discharge control signal outputted from the MCU 70 to the gate of the transistor Q4 is low level, and the transistor Q4 is kept in an OFF state.

When the MCU 70 is activated by the detection signal (low level) from the switch operation detection circuit 68, the MCU 70 makes the discharge control signal high level to turn on the transistor Q4, and allows discharge from the battery 50 to the drive motor M1.

In short, when the transistor Q4 is brought into an ON state, the transistor Q2 in the input/output circuit 38 in the main body 10 is brought into an OFF state and the transistor Q1 provided on the current path to the drive motor M1 is brought into an ON state. As a result, a current flows through the drive motor M1 to rotate the drive motor M1.

When the MCU 70 makes the discharge control signal high level as such and allows the discharge from the battery 50 to the drive motor M1 (i.e., during the discharge from the battery 50), the MCU 70 executes a discharge control process that protects the battery 50 from overdischarge and the like.

In the discharge control process, a discharge current limitation processing, an overdischarge limitation processing, and a battery temperature limitation processing are performed which limit the discharge from the battery 50 to the drive motor M1 based on detection results by the current measurement circuit 62, the voltage measurement circuit 64, and the temperature measurement circuit 66.

The discharge current limitation processing here is a processing to determine that overcurrent is flowing when the discharge current detected in the current measurement circuit 62 during the discharge has exceeded a preset threshold value, and to suspend the discharge from the battery 50 to the drive motor M1 by making the discharge control signal low level.

The overdischarge limitation processing is a processing to determine that the battery 50 is in an overdischarge state when the battery voltage detected in the voltage measurement circuit 64 during the discharge has been lowered below a preset threshold value, and to suspend the discharge from the battery 50 to the drive motor M1 by making the discharge control signal low level.

The battery temperature limitation processing is a processing to determine that the battery 50 is in an overheat state when the battery temperature detected in the temperature measurement circuit 66 during the discharge has exceeded a preset threshold value, and to suspend the discharge from the battery 50 to the drive motor M1 by making the discharge control signal low level.

When the discharge control signal is made low level and the discharge from the battery 50 to the drive motor M1 is suspended in any of the above-described limitation processings, a user detects an abnormality and releases the trigger switch 22. Consequently, the main switch SW1 is brought into an OFF state, and on a side of the main body 10, the power supply voltage Vcc outputted from the control power circuit 36 is lowered, to thereby make an input signal from the signal terminal 34A to the signal terminal 46A low level.

Accordingly, when the MCU 70 has suspended the discharge from the battery 50 to the drive motor M1 in the above-described limitation processings, the MCU 70 recognizes that the main switch SW1 has been turned off by determining whether or not the detection signal from the switch operation detection circuit 68 has become high level.

After recognizing that the main switch SW1 has been turned off, the MCU 70 waits for the main switch SW1 to be turned on until a predetermined time period elapses. When the main switch SW1 is turned on before the predetermined time period elapses, the MCU 70 makes the discharge control signal high level again, and allows the discharge (in other words, drive of the drive motor M1. If the main switch SW1 is not turned on before the predetermined time period elapses, the MCU 70 shifts to a sleep mode.

Since the MCU 70 continues to output the discharge control signal (high level) unless an abnormality such as overcurrent is determined to exist in the above-described limitation processings, the MCU 70 cannot detect an OFF state of the main switch SW1 (in other words, a suspension of operation of the trigger switch 22) via the switch operation detection circuit 68.

Accordingly, the MCU 70 measures a suspension period of current-carrying to the drive motor M1 based on the detection signal from the current measurement circuit 62 and the like while the MCU 70 is outputting the discharge control signal (high level) after shifting from a sleep mode to a normal mode. Then, the MCU 70 shifts to a sleep mode when the suspension period of current-carrying has reached a predetermined time period.

When the MCU 70 determines overdischarge of the battery 50 to exist in the above-described discharge control process and suspends the discharge, the MCU 70 stores a history of the overdischarge in a non-volatile memory.

Next, when the MCU 70 is activated by the detection signal (low level) from the battery charger detection circuit 72, the MCU 70 outputs various information showing a status (battery voltage, battery capacity, and the like) of the battery 50 to the MCU 96 of the battery charger 80 through the signal terminals 46B and 86B, and then, executes a charge control process for battery protection when charge from the battery charger 80 to the battery 50 is started.

The charge control process is executed in such a manner that it is determined whether or not an abnormality such as overcharge to the battery 50 and/or overheat of the battery 50 has occurred based on the detection result by each of the above-described measurement circuits 62, 64, and 66, and, if an abnormality is determined to exist, a command signal to suspend charging or to reduce charge current is transmitted to the battery charger 80 through the signal terminals 46B and 86B.

Then, when the MCU 70 determines overcharge of the battery 50 to exist and suspends charging in the charge control process, the MCU 70 stores a history of the overcharge in the non-volatile memory.

The charge control process is continued until the detection signal from the battery charger detection circuit 72 becomes high level (in other words, until the power supply voltage Vee ceases to be inputted from the battery charger 80). When the detection signal becomes high level, the MCU 70 determines that the battery pack 40 has been detached from the battery charger 80, and shifts to a sleep mode.

As described above, the MCU 70 in the battery pack 40 monitors charge/discharge current, battery voltage, battery temperature and the like via the current measurement circuit 62, the voltage measurement circuit 64, and the temperature measurement circuit 66, respectively, during the discharge from the battery 50 to the drive motor M1 and during the charge from the battery charger 80 to the battery 50. When each of these parameters has exceeded or fallen below the predetermined threshold value, the MCU 70 suspends the discharge or the charge to protect the battery 50.

In a conventional control as such, however, since a heat generation amount (in other words, an internal temperature) of the battery 50 cannot be detected, it is difficult to reliably protect the battery 50 from overheat. In some cases, for example, although the discharge current and/or a surface temperature are less than the threshold values, the internal temperature of the battery 50 exceeds a proper temperature range depending on a driven state of the electric power tool, to thereby deteriorate the battery 50.

Figure 6:
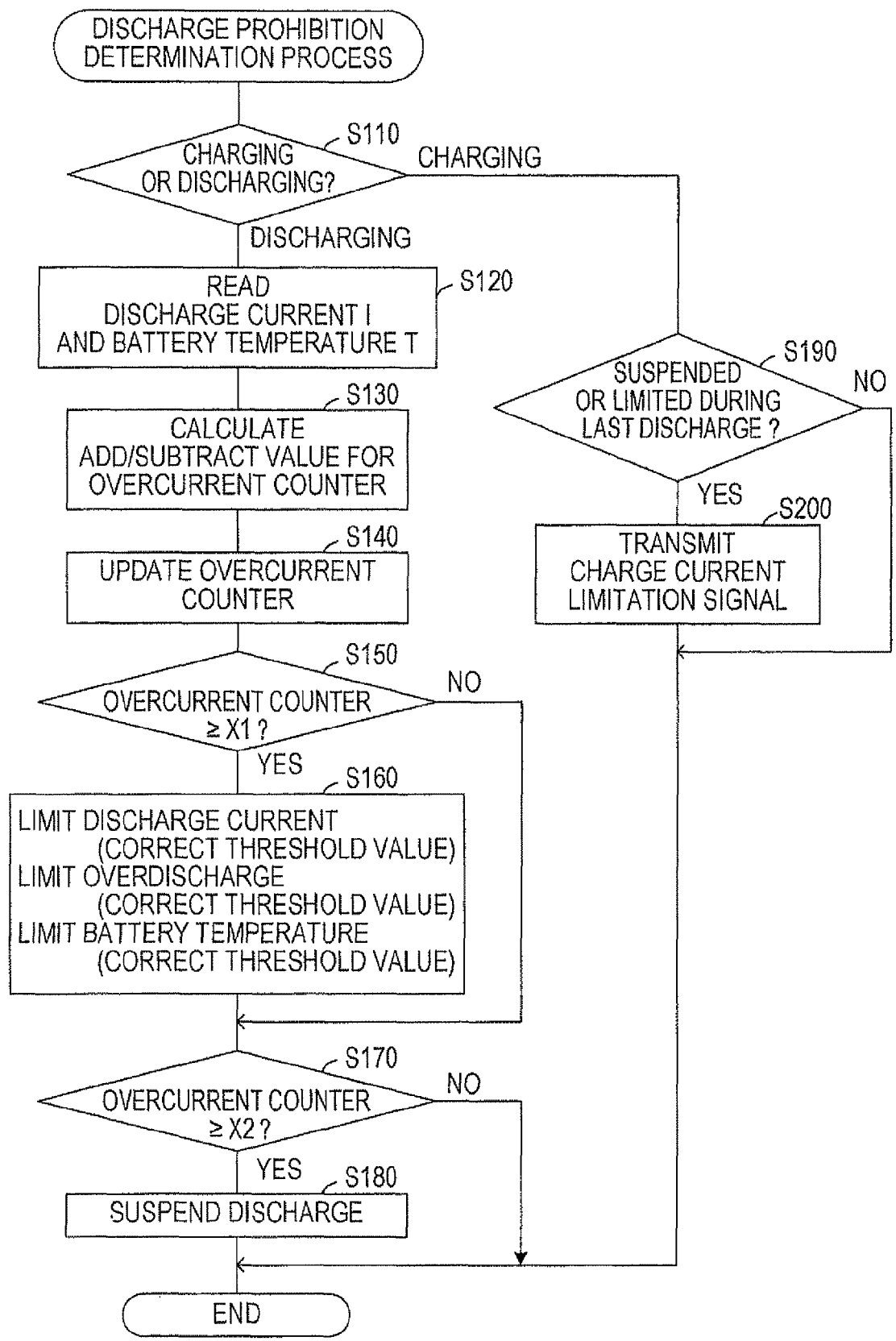
FIG. 6 is a flowchart showing a discharge prohibition determination process executed by an MCU in the battery pack.

Accordingly, in the present embodiment, the MCU 70 is designed to execute a discharge prohibition determination process shown in FIG. 6 in addition to the above-described control processes when the MCU 70 is in a normal mode.

An explanation will be given below about the discharge prohibition determination process.

(Discharge Prohibition Determination Process)

The discharge prohibition determination process is a process repeatedly executed by the MCU 70 in a constant cycle (for example, per 0.5 seconds). When the process is started, it is firstly determined in S110 (S represents a step) whether discharge from the battery 50 is being performed or whether charge to the battery 50 is being performed at this point in time.

If discharge from the battery 50 is being performed at this point in time, the process proceeds to subsequent S120, and a discharge current I and a battery temperature T are respectively read from the current measurement circuit 62 and the temperature measurement circuit 66. What is performed in S120 is not only to read the discharge current I and the battery temperature T. A plurality of the discharge currents I and the battery temperatures T read so far (in other words, read during a given period of time) are respectively averaged or moving-averaged, to thereby remove an error component (in other words, an unnecessary noise component) of the discharge current I and the battery temperature T obtained respectively from the current measurement circuit 62 and the temperature measurement circuit 66.

Next, in S130, an add/subtract value for updating an over-current counter is calculated based on the discharge current I and the battery temperature T at this point in time obtained in the processing of S120. In subsequent S140, the overcurrent counter is updated by adding the calculated add/subtract value to the overcurrent counter.

Here, the overcurrent counter is designed to store a value equivalent to a heat generation amount of the battery 50 as a count value, and the value is an estimated value representing a heat generation amount of the battery 50.

When the add/subtract value for updating the overcurrent counter is calculated based on the discharge current I and the battery temperature T in S130, a map is used for the calculation, for example.

Figure 7:
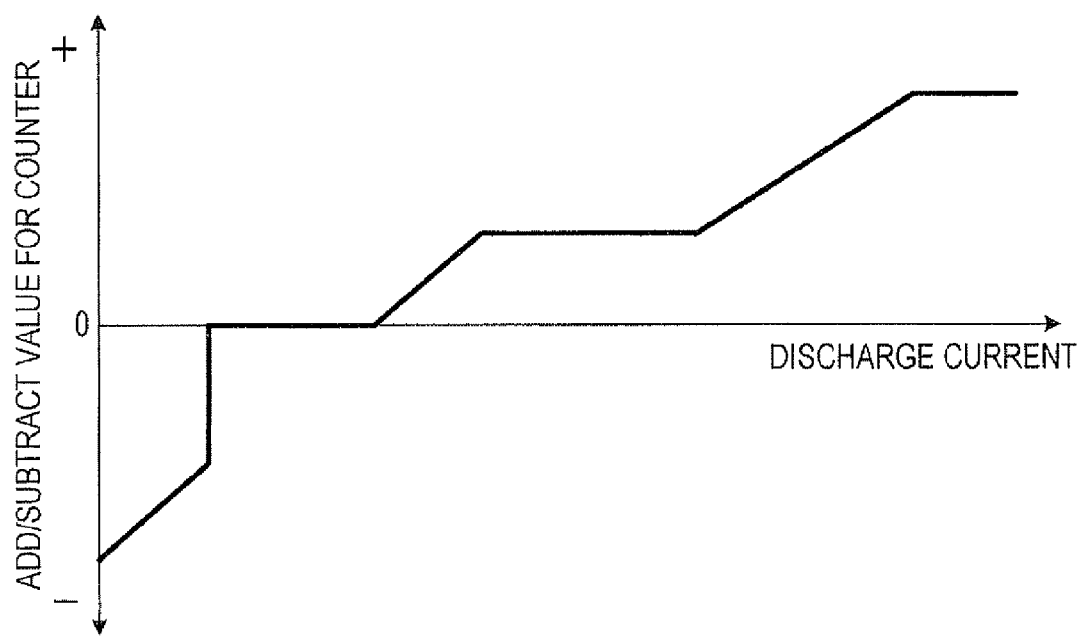
FIG. 7 is an explanatory diagram for explaining an operation of the discharge prohibition determination process in FIG. 6.

The map is configured such that the add/subtract value is set to zero or a negative value if the discharge current I is less than the threshold value, and the add/subtract value is set to a positive value if the discharge current I is equal to or greater than the threshold value as shown in FIG. 7, for example. Such a map is prepared in plurality for each predetermined temperature range of the battery 50. The MCU 70 selects the map corresponding to the battery temperature T in S130, and calculates the add/subtract value corresponding to the discharge current I using the map.

The map for calculating the add/subtract value in FIG. 7 is set such that the greater the discharge current I is, the greater the add/subtract value is for each temperature range of the battery 50. Furthermore, when the maps having different temperature ranges are compared with each other, the maps are so set as to have a greater add/subtract value for the discharge current as the battery temperature is higher. This is because the greater the discharge current I is, the more easily the battery 50 generates heat, whereby the battery temperature T (specifically, a surface temperature of the battery 50, and thus an ambient temperature) easily rises excessively.

When the add/subtract value is calculated in S130, the above-described map does not necessarily need to be employed, but it is possible to employ a two-dimensional map, in which the discharge current I and the battery temperature T are used as parameters; or an arithmetic expression F(I,T), in which each of these values I and T is used as a parameter.

Next, after the overcurrent counter is updated in S140, the process proceeds to S150, and it is determined whether or not a value of the updated overcurrent counter is equal to or greater than a first set value X1 for overcurrent determination.

If the value of the overcurrent counter is equal to or greater than the first set value X1, it is determined that the internal temperature of the battery 50 is beyond an allowable range, and the process proceeds to S160. In S160, the discharge from the battery 50 is limited by correcting the threshold values used for determining suspension of the discharge in the above-described discharge current limitation processing, the overdischarge limitation processing, and the battery temperature limitation processing.

Specifically, the suspension of the discharge in each of the limitation processings is facilitated to be performed by lowering the threshold value for overcurrent determination used in the discharge current limitation processing; raising the threshold value for overdischarge determination used in the overdischarge limitation processing; and lowering the threshold value for overheat determination used in the battery temperature limitation processing.

In S160, each correction value used in correcting each of the above-described threshold values may be a constant value or may be set in accordance with the value of the overcurrent counter in such a manner that the greater the value of the overcurrent counter is, the greater the correction value is.

If it is determined in S150 that the value of the overcurrent counter is less than the first set value X1, or if the discharge from the battery 50 is limited by correcting each of the threshold values in S160, the process proceeds to S170, and it is determined whether or not the value of the overcurrent counter is equal to or greater than a second set value X2, which is greater than the first set value X1.

If the value of the overcurrent counter is equal to or greater than the second set value X2, it is determined that the internal temperature of the battery 50 has reached a limit temperature that leads to deterioration of the battery 50, and the process proceeds to S180. In S180, the discharge from the battery 50 is suspended by switching the discharge control signal from high level to low level.

If it is determined in S170 that the value of the overcurrent counter is less than the second set value X2, or if the discharge from the battery 50 is suspended in S180, the discharge prohibition determination process is terminated for the time being. Then, after a predetermined time period has elapsed, the processings of S110 and after are performed again.

Next, if it is determined in S110 that the battery 50 is being charged at this point in time, the process proceeds to S190. In S190, it is determined whether or not the value of the overcurrent counter of the battery 50 reached the first set value X1 or the second set value X2 during a last discharge and thereby the discharge from the battery 50 was limited or suspended.

If the discharge from the battery 50 was limited or suspended during the last discharge, the battery 50 is determined to be in a state where the internal temperature easily rises, and the process proceeds to S200. In S200, an upper limit of the charge current to the battery 50 is lowered below that in normal times by transmitting a charge current limitation signal to the MCU 96 of the battery charger 80, and the discharge prohibition determination process is terminated.

In contrast, if it is determined in S190 that the discharge from the battery 50 was not limited or suspended during the last discharge, the discharge prohibition determination process is terminated without any further processing.

(Effects of the Embodiment)

As described hereinabove, in the present embodiment, the MCU 70 provided in the battery pack 40 executes the discharge prohibition determination process shown in FIG. 6.

In the discharge prohibition determination process, during the discharge from the battery pack 40 to the drive motor M1, the add/subtract value of the overcurrent counter is calculated periodically using the discharge current I and the battery temperature T, and the estimated value representing the heat generation amount of the battery 50 (=the value of the overcurrent counter) is determined by updating the overcurrent counter with the calculated add/subtract value (S110-S140).

If the estimated value is equal to or greater than the first set value X1, limitation is imposed on the discharge from the battery 50 by correcting the threshold values used for discharge control, and if the estimated value is equal to or greater than the second set value X2, the discharge from the battery 50 is suspended (S150-S180).

Thus, in the present embodiment, since the overcurrent counter is periodically updated using the add/subtract value calculated from the discharge current I using the map shown in FIG. 7, the value of the overcurrent counter reaches the first set value X1 or the second set value X2 in a short period of time when the discharge current I is large, and a time required to reach the first set value X1 or the second set value X2 becomes longer when the discharge current I is small.

This is because the value of the overcurrent counter corresponds to the heat generation amount (in other words, the internal temperature) of the battery 50 and, therefore, according to the present embodiment, the heat generation amount (in other words, the internal temperature) of the battery 50 can be accurately estimated using the overcurrent counter.

Furthermore, in the present embodiment, since the discharge from the battery 50 is limited or suspended based on the estimated heat generation amount (the value of the overcurrent counter), the battery 50 can be protected from overheat without unnecessarily suspending or limiting the discharge.

Figure 8:
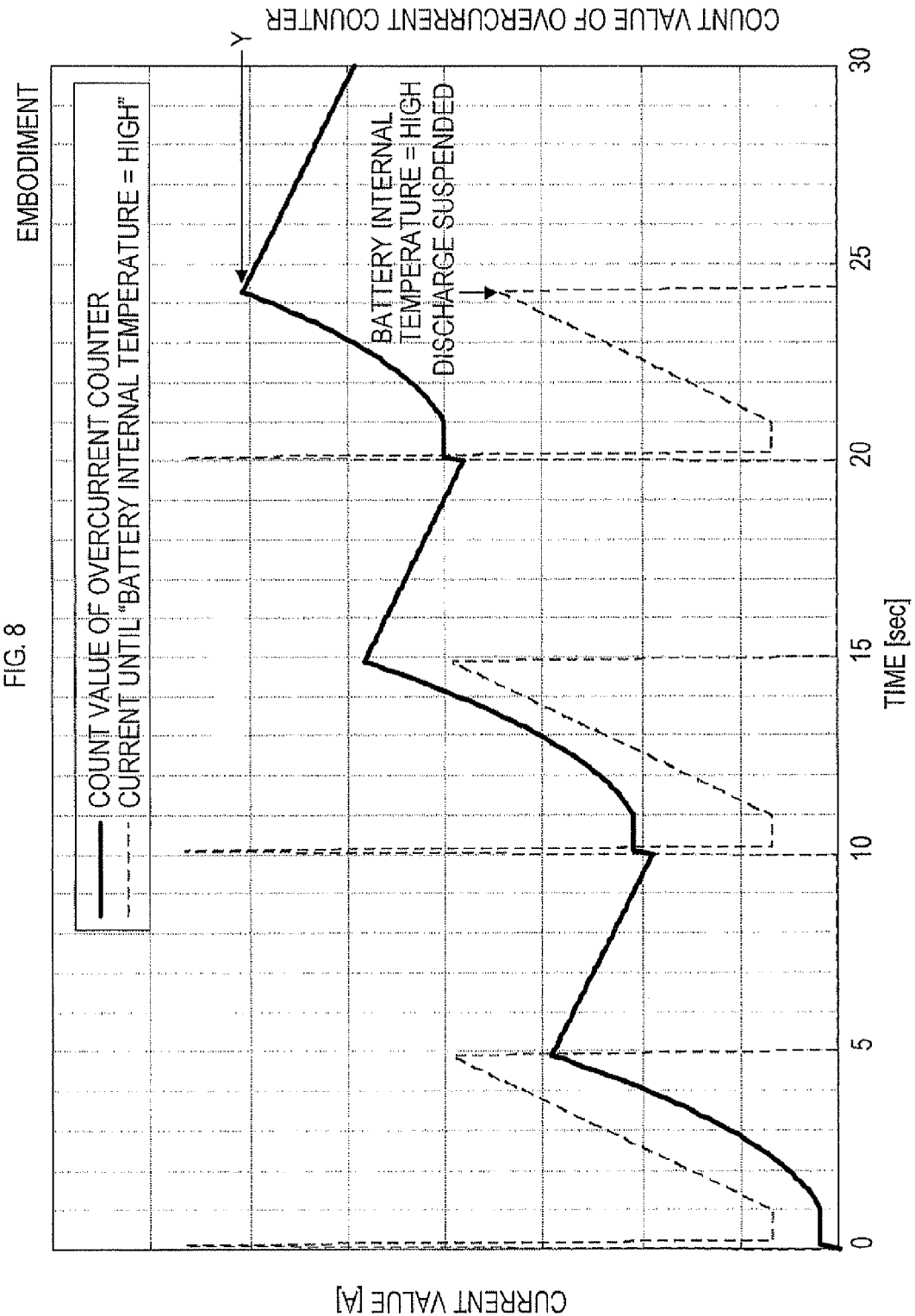
FIG. 8 is an explanatory diagram showing changes in count values of an overcurrent counter of the embodiment and a discharge suspension operation.

For example, FIG. 8 shows measurement results of the current value of the discharge current and the count value of the overcurrent counter under the assumption that a user repeatedly operates the trigger switch 22 for screwing or the like.

As is obvious from FIG. 8, when the user repeatedly operates the trigger switch 22, the count value of the overcurrent counter is raised in accordance with a value of the current flowing during an operation of the trigger switch 22, and is reduced during a suspension of operation of the trigger switch 22. Changes in the count value is set to correspond to changes in the heat generation amount (and thus, the internal temperature) of the battery 50 based on the map shown in FIG. 7.

Thus, according to the present embodiment, when the heat generation amount (and thus, the internal temperature) of the battery 50 becomes large enough to necessitate suspension of the discharge, the count value of the overcurrent counter reaches a threshold value "Y"(= the second set value X2) to suspend the discharge.

In contrast, in conventional art, overheat of the battery 50 is determined to exist based only on the discharge current, and the discharge is thus suspended. Therefore, as shown in FIG. 9, when the user operates the trigger switch 22 in a manner similar to the foregoing, if the discharge current becomes higher, the discharge is to be suspended in spite of the fact that the internal temperature is not high. FIG. 9 is an explanatory diagram illustrating a case where conditions for suspending the discharge are that the discharge current of the battery 50 has become equal to or greater than a threshold value "X" and that such a state continues for one second or more.

Thus, according to the present embodiment, the battery 50 can be protected form overheat without unnecessarily suspending or limiting the discharge, to thereby improve usability of the electric power tool.

Also, in the discharge prohibition determination process of the present embodiment, when the discharge is limited or suspended based on the overcurrent counter (the estimated value of the heat generation amount) during the discharge from the battery 50, the charge current limitation signal is transmitted to the MCU of the battery charger 80 during a next charge to the battery 50, to thereby limit the upper limit of the charge current more than in normal times. Thus, according to the present embodiment, overheat of the battery 50 can be suppressed during the next charge to the battery 50.

Here, in the present embodiment, the current measurement circuit 62 provided in the battery pack 40 corresponds to an example of a current detection device, and the temperature measurement circuit 66 corresponds to an example of a temperature detection device.

The processings of S120-S140 in the discharge prohibition determination process shown in FIG. 6 correspond to an example of a computation device of the present invention. Among these, the processing of S130 corresponds to an example of an add/subtract value setting device of the present invention.

The determination processings of S150 and S170 in the discharge prohibition determination process shown in FIG. 6 correspond to an example of a determination device of the present invention, and the processings of S160, S180, and S200 correspond to an example of a protection device of the present invention.

MODIFIED EXAMPLES

Although one embodiment of the present invention has been described above, the present invention should not be limited to the above-described embodiment, but may be practiced in various forms within a scope not departing from the spirit of the present invention.

For example, it has been described in the above-described embodiment that, when calculating the add/subtract value of the overcurrent counter, the discharge current I and the battery temperature T are used. However, the add/subtract value may be calculated only with the discharge current I.

Also, it has been described in the above-described embodiment that the limitation of the discharge and the suspension of the discharge are performed in accordance with the value of the overcurrent counter (the estimated value of the heat generation amount). However, even when it is so configured that either of the limitation of the discharge and the suspension of the discharge is performed, the battery 50 can be protected preferably compared to conventional apparatuses.

Moreover, it has been described in the above-described embodiment that the heat generation amount of the battery 50 is estimated using the overcurrent counter during the discharge from the battery 50, and the limitation and the suspension of the discharge are controlled. In this connection, it is also possible that the heat generation amount of the battery 50 is estimated during the charge to the battery 50 in a similar manner to that in the above-described embodiment, and the charge to the battery 50 is limited or suspended.

Furthermore, it has been described in the above-described embodiment that the discharge prohibition determination process shown in FIG. 6 is executed by the MCU 70 in the battery pack 40. However, the discharge prohibition determination process may be executed by an MCU for discharge control, which is provided on a side of the main body 10.

Still further, in a case where the charge to the battery 50 is limited or suspended by estimating the heat generation amount of the battery 50 during the charge to the battery 50 as described above, a charge prohibition determination process therefor may be executed by the MCU 70 in the battery pack 40, or by the MCU 96 in the battery charger 80.

On the other hand, while a case where the present invention is applied to the driver drill has been described in the above-described embodiment, the present invention may be applied to an electric power tool other than the driver drill.

Also, while the brushed DC motor is employed as the drive motor M1 in the above-described embodiment, a brushless DC motor or an AC motor may be employed. However, in a case where the brushless DC motor or the AC motor is employed as the drive motor M1, the main body 10 needs to be configured accordingly.

Moreover, while the transistors employed in the above-described embodiment are the bipolar transistor or the MOSFET, a switching element other than these may be employed.

The invention claimed is:

1. A heat generation amount estimation unit for battery for electric power tool, which is provided in an apparatus for electric power tool and estimates a heat generation amount of a battery that is a power source of an electric power tool, the unit comprising:

a computation device that periodically reads, either during a discharge from the battery or during a charge to the battery, a detected current from a current detection device, which detects a current corresponding to this point in time from among a discharge current flowing from the battery and a charge current flowing into the battery, and adds/subtracts a heat generation amount equivalent value in accordance with a value of the read detected current, wherein the computation device outputs the added/subtracted heat generation amount equivalent value as an estimated value representing the heat generation amount of the battery.

2. The heat generation amount estimation unit for battery for electric power tool according to claim 1, wherein the computation device comprises an add/subtract value setting device that sets an add/subtract value in such a manner that, when the value of the detected current is less than a predetermined threshold value, a negative add/subtract value including zero is set such that the smaller the value of the detected current is, the greater an absolute value is; and, when the value of the detected current is equal to or greater than the predetermined threshold value, a positive add/subtract value is set such that the greater the value of the detected current is, the greater the add/subtract value is, and wherein the heat generation amount equivalent value is updated by adding the negative add/subtract value or the positive add/subtract value set by the add/subtract value setting device to the heat generation amount equivalent value.

3. The heat generation amount estimation unit for battery for electric power tool according to claim 2, wherein the add/subtract value setting device sets the add/subtract value based on the value of the detected current and a detected temperature from a temperature detection device, which detects a temperature of the battery, such that the greater the value of the detected current is and the higher the detected temperature is, the greater the add/subtract value is.

4. An apparatus for electric power tool comprising:
the heat generation amount estimation unit for battery for electric power tool according to claim 1;
a determination device that determines whether or not the estimated value representing the heat generation amount of the battery obtained by the heat generation amount estimation unit has exceeded a set value for overheat determination set in advance; and
a protection device that protects the battery by performing, if it is determined by the determination device that the estimated value has exceeded the set value, either of a suspension processing suspending an operation corresponding to this point in time from among the discharge from the battery and the charge to the battery and a limitation processing limiting the operation corresponding to this point in time from among the discharge from the battery and the charge to the battery.

5. The apparatus for electric power tool according to claim 4,
wherein, if it is determined by the determination device that the estimated value has exceeded the set value, the protection device limits either of the discharge from the battery and the charge to the battery by correcting a control threshold value used either for a discharge control of the battery or for a charge control of the battery.

6. The apparatus for electric power tool according to claim 5,
wherein, if it is determined by the determination device that the estimated value has exceeded the set value either during the discharge from the battery or during the charge to the battery, the protection device corrects a control threshold value used either during a next charge to the battery or during a next discharge from the battery.

7. The apparatus for electric power tool according to claim 4,
wherein the apparatus is any of a battery pack containing the battery therein, an electric power tool main body to which the battery pack is detachably attached, and a battery charger to which the battery pack is detachably attached.

8. An apparatus for electric power tool comprising:
the heat generation amount estimation unit for battery for electric power tool according to claim 2;
a determination device that determines whether or not the estimated value representing the heat generation amount of the battery obtained by the heat generation amount estimation unit has exceeded a set value for overheat determination set in advance; and
a protection device that protects the battery by performing, if it is determined by the determination device that the estimated value has exceeded the set value, either of a suspension processing suspending an operation corresponding to this point in time from among the discharge from the battery and the charge to the battery and a limitation processing limiting the operation corresponding to this point in time from among the discharge from the battery and the charge to the battery.

9. The apparatus for electric power tool according to claim 8,
wherein, if it is determined by the determination device that the estimated value has exceeded the set value, the protection device limits either of the discharge from the battery and the charge to the battery by correcting a control threshold value used either for a discharge control of the battery or for a charge control of the battery.

10. The apparatus for electric power tool according to claim 9,
wherein, if it is determined by the determination device that the estimated value has exceeded the set value either during the discharge from the battery or during the charge to the battery, the protection device corrects a control threshold value used either during a next charge to the battery or during a next discharge from the battery.

11. The apparatus for electric power tool according to claim 8,
wherein the apparatus is any of a battery pack containing the battery therein, an electric power tool main body to which the battery pack is detachably attached, and a battery charger to which the battery pack is detachably attached.

12. An apparatus for electric power tool comprising:
the heat generation amount estimation unit for battery for electric power tool according to claim 3;
a determination device that determines whether or not the estimated value representing the heat generation amount of the battery obtained by the heat generation amount estimation unit has exceeded a set value for overheat determination set in advance; and
a protection device that protects the battery by performing, if it is determined by the determination device that the estimated value has exceeded the set value, either of a suspension processing suspending an operation corresponding to this point in time from among the discharge from the battery and the charge to the battery and a limitation processing limiting the operation corresponding to this point in time from among the discharge from the battery and the charge to the battery.

13. The apparatus for electric power tool according to claim 12,
wherein, if it is determined by the determination device that the estimated value has exceeded the set value, the protection device limits either of the discharge from the battery and the charge to the battery by correcting a control threshold value used either for a discharge control of the battery or for a charge control of the battery.

14. The apparatus for electric power tool according to claim 13,
wherein, if it is determined by the determination device that the estimated value has exceeded the set value either during the discharge from the battery or during the charge to the battery, the protection device corrects a control threshold value used either during a next charge to the battery or during a next discharge from the battery.

15. The apparatus for electric power tool according to claim 12,
wherein the apparatus is any of a battery pack containing the battery therein, an electric power tool main body to which the battery pack is detachably attached, and a battery charger to which the battery pack is detachably attached.

* * * * *